(12) United States Patent
Tomasini et al.

(10) Patent No.: US 7,427,556 B2
(45) Date of Patent: Sep. 23, 2008

(54) METHOD TO PLANARIZE AND REDUCE DEFECT DENSITY OF SILICON GERMANIUM

(75) Inventors: Pierre Tomasini, Tempe, AZ (US); Nyles Cody, Tempe, AZ (US); Chantal Arena, Mesa, AZ (US)

(73) Assignee: ASM America, Inc., Phoenix, AZ (US)

( * ) Notice: Subject to any disclaimer, the term of this patent is extended or adjusted under 35 U.S.C. 154(b) by 797 days.

(21) Appl. No.: 10/799,335

(22) Filed: Mar. 12, 2004

(65) Prior Publication Data

US 2004/0259333 A1    Dec. 23, 2004

Related U.S. Application Data

(60) Provisional application No. 60/454,867, filed on Mar. 12, 2003.

(51) Int. Cl.
*H01L 21/20* (2006.01)
*C30B 23/00* (2006.01)

(52) U.S. Cl. .................. 438/507; 438/592; 117/86; 117/92

(58) Field of Classification Search ............... 438/507, 438/592; 117/86, 92
See application file for complete search history.

(56) References Cited

U.S. PATENT DOCUMENTS

| | | |
|---|---|---|
| 3,602,778 A | 8/1971 | Ura et al. |
| 3,720,877 A | 3/1973 | Zarowin |
| 3,729,645 A | 4/1973 | Redington |
| 3,737,739 A | 6/1973 | Blakeslee et al. |
| 3,984,718 A | 10/1976 | Fein et al. |
| 3,984,857 A | 10/1976 | Mason |
| 3,985,590 A | 10/1976 | Mason |
| 4,461,820 A | 7/1984 | Shirai et al. |
| 4,656,013 A | 4/1987 | Hiai et al. |
| 4,699,892 A | 10/1987 | Suzuki |
| 4,786,574 A | 11/1988 | Shirai et al. |
| 4,803,186 A | 2/1989 | Chen et al. |
| 4,857,270 A | 8/1989 | Maruya et al. |
| 4,868,014 A | 9/1989 | Kanai et al. |
| 4,983,274 A | 1/1991 | Chen et al. |
| 5,037,775 A | 8/1991 | Reisman |

(Continued)

FOREIGN PATENT DOCUMENTS

EP    0858101    2/1998

(Continued)

OTHER PUBLICATIONS

Mayer, J. and Lau, S.S., Electronic Materials Science: For Integrated Circuits in Si and GaAs, 1990, Macmillan, p. 40.*

(Continued)

*Primary Examiner*—Robert M. Kunemund
*Assistant Examiner*—G. Nagesh Rao
(74) *Attorney, Agent, or Firm*—Knobbe, Martens, Olson & Bear LLP

(57) ABSTRACT

A method for blanket depositing a SiGe film comprises intermixing a silicon source, a germanium source and an etchant to form a gaseous precursor mixture. The method further comprises flowing the gaseous precursor mixture over a substrate under chemical vapor deposition conditions to deposit a blanket layer of epitaxial SiGe onto the substrate, whether patterned or un-patterned.

52 Claims, 1 Drawing Sheet

U.S. PATENT DOCUMENTS

| | | | |
|---|---|---|---|
| 5,112,439 | A | 5/1992 | Reisman et al. |
| 5,281,274 | A | 1/1994 | Yoder |
| 5,281,299 | A | 1/1994 | Escoffier et al. |
| 5,294,285 | A | 3/1994 | Kanai et al. |
| 5,316,958 | A | 5/1994 | Meyerson |
| 5,366,554 | A | 11/1994 | Kanai et al. |
| 5,482,557 | A | 1/1996 | Kanai et al. |
| 5,576,247 | A | 11/1996 | Yano et al. |
| 5,646,073 | A | 7/1997 | Grider et al. |
| 5,667,586 | A | 9/1997 | Ek et al. |
| 5,818,100 | A | 10/1998 | Grider et al. |
| 6,242,080 | B1 | 6/2001 | Kondo |
| 6,451,641 | B1 | 9/2002 | Halliyal et al. |
| 6,515,219 | B2 | 2/2003 | Kondo |
| 6,646,073 | B2 | 11/2003 | Farrer et al. |
| 6,709,901 | B1 | 3/2004 | Yamazaki et al. |
| 6,875,279 | B2 | 4/2005 | Chu et al. |
| 7,026,219 | B2 * | 4/2006 | Pomarede et al. .......... 438/285 |
| 2002/0125471 | A1 * | 9/2002 | Fitzgerald et al. ............. 257/19 |
| 2002/0173130 | A1 * | 11/2002 | Pomerede et al. .......... 438/592 |
| 2003/0010978 | A1 | 1/2003 | Burden |
| 2003/0045063 | A1 | 3/2003 | Oda |
| 2003/0082300 | A1 | 5/2003 | Todd et al. |
| 2003/0111013 | A1 | 6/2003 | Oosterlaken et al. |
| 2003/0124818 | A1 | 7/2003 | Luo et al. |
| 2003/0157787 | A1 | 8/2003 | Murthy et al. |
| 2003/0207127 | A1 | 11/2003 | Murthy et al. |
| 2003/0235931 | A1 | 12/2003 | Wada et al. |
| 2005/0079692 | A1 | 4/2005 | Samoilov et al. |

FOREIGN PATENT DOCUMENTS

| | | |
|---|---|---|
| JP | 62017004 | 1/1987 |
| WO | WO 00/15885 | 3/2000 |

OTHER PUBLICATIONS

Cannon, D. et al., "Tensile strained epitaxial Ge films on Si(100) substrates with potential application in L-band telecommunications," Applied Physics Letter, vol. 84, No. 6, Feb. 9, 2004, pp. 906-908.

Colace, L. et al., "Efficient high-speed near-infrared Ge photodetectors integrated on Si substrates," Applied Physics Letters, vol. 76, No. 10, Mar. 6, 2000, pp. 1231-1233.

Colace, L. et al., "Ge-on-Si Approaches to the Detection of Near-Infrared Light," IEEE Journal of Quantum Electronics, vol. 35, No. 12, Dec. 1999, pp. 1843-1852.

Fama, S. et al., "High performance germanium-on silicon detectors for optical communications," Applied Physics Letters, vol. 81, No. 4, Jul. 22, 2002, pp. 586-588.

Hull, R., "Metastable strained layer configurations in the SiGe/Si System," (1999) *EMIS Datareviews, Series* No. 24 *of SiGe and SiGe:C*, edited by Erich Kasper et al., INSPEC (2000). London, UK.

Ishikawa, Y. et al., "Strain-induced band gap shrinkage in Ge grown on Si substrate," Applied Physics Letters, vol. 82, No. 12, Mar. 31, 2003, pp. 2044-2046.

Lee et al., "Growth of strained Si and strained Ge heterostructures on relaxed $Si_{1x}G_{ax}$Gaby ultrahigh vacuum chemical vapor deposition," J. Vac. Sci. Technol. B 22(1) (Jan./Feb. 2004).

Li, Q, et al., "Selective growth of Ge on Si(100) through vias of SiO2 nanotemplate using solid source molecular beam epitaxy," Applied Physics Letters, vol. 83, No. 24, Dec. 15, 2003, pp. 5032-5034.

Liu, J. et al., "Silicidation—induced band gap shrinkage In Ge epitaxial films on Si," Applied Physics Letters, vol. 84, No. 5, Feb. 2, 2004, pp. 660-662.

Masini, G. et al., "High-Performance p-i-n Ge on Si Photodetectors for the Near Infrared: From Model to Demonstration," IEEE Transactions of Electron Devices, vol. 48, No. 6, Jun. 2001, pp. 1092-1096.

Schollhorn et al., "Coalescence of geranium islands on silicon," Thin Solid Films, vol. 336 (1988), pp. 109-111.

* cited by examiner

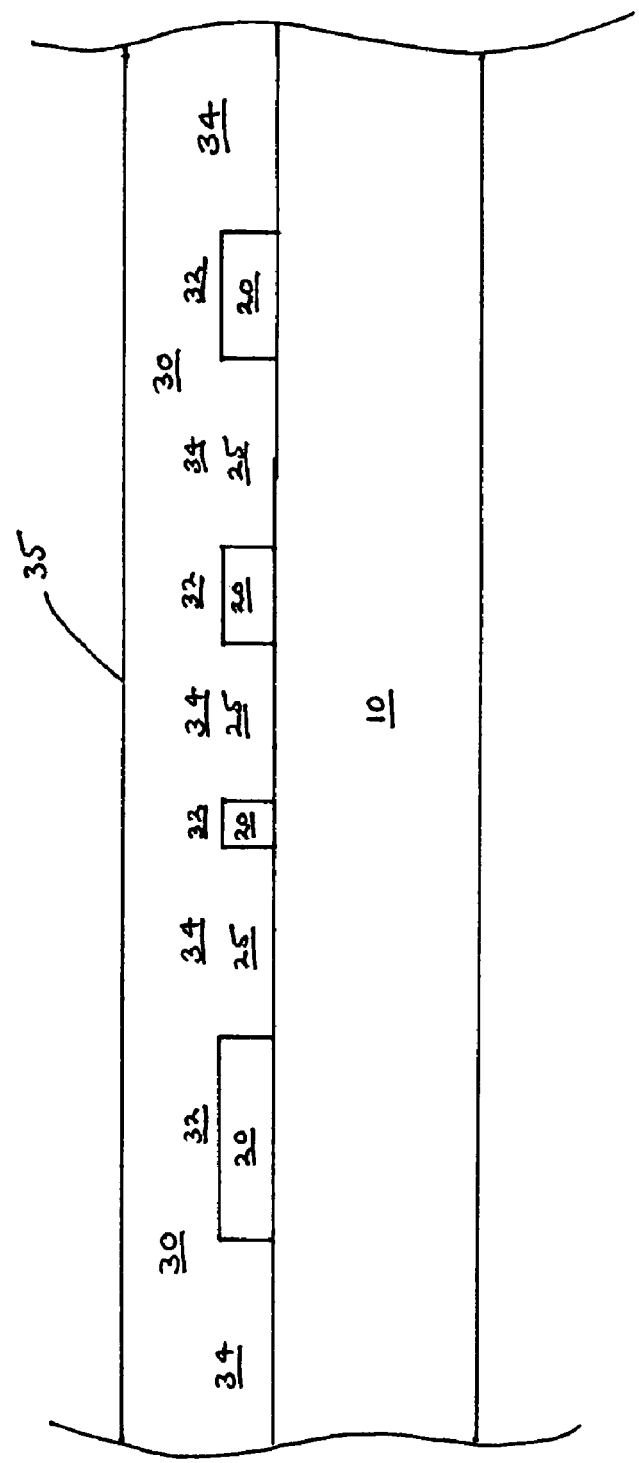
figure one

METHOD TO PLANARIZE AND REDUCE DEFECT DENSITY OF SILICON GERMANIUM

PRIORITY APPLICATION

This application claims the benefit of U.S. Provisional Application 60/454,867, filed 12 Mar. 2003, the entire disclosure of which is hereby incorporated by reference herein.

FIELD OF THE INVENTION

This invention relates generally to deposition of silicon germanium films, such as used in integrated circuit fabrication. This invention relates more particularly to methods for increasing the planarity and/or reducing the defect density of blanket-deposited silicon germanium films.

BACKGROUND OF THE INVENTION

A variety of methods are used in the semiconductor manufacturing industry to deposit materials onto surfaces. For example, one widely used method is chemical vapor deposition ("CVD"), in which atoms or molecules contained in a vapor are deposited onto a surface and built up to form a film. Multiple deposition steps can be sequenced to produce devices with several layers. In such multi-layer processes, it is generally desired to maintain planarity from level to level during the deposition processes. Poor planarity, particularly during early deposition steps, tends to be amplified through higher levels of device fabrication. Poor planarity can create problems for photolithographic steppers, risking misalignment in precise masking steps.

Silicon germanium (SiGe) films, which are used in a wide variety of semiconductor applications, can be deposited using a CVD process in which silicon and germanium are delivered to a surface where they react and form a film. SiGe films formed using CVD processes can have various morphologies, including single crystalline, amorphous, and polycrystalline. In epitaxial deposition of a SiGe film, the initial crystalline structure and morphology of the deposited film follows the crystalline information of the underlying material onto which the epitaxial deposition occurs. Additionally, SiGe films can be formed in a selective deposition process or in a blanket deposition process. In a selective deposition, the film is deposited over certain areas of a substrate, whereas in a blanket deposition, the film is deposited over substantially the entire substrate.

SUMMARY OF THE INVENTION

When an epitaxial SiGe film is deposited onto a single crystal silicon film, strain is generated at the interface between the layers. A deposited epitaxial layer is said to be "strained" when it is constrained to have a lattice structure in at least two dimensions that is the same as that of the underlying single crystal substrate, but different from its inherent lattice constant. Epitaxial deposition of one material over a different material is often referred to as "heteroepitaxial" deposition. Lattice strain occurs because the atoms in the deposited film depart from the positions that they would normally occupy in the lattice structure of the free-standing, bulk material. The degree of strain depends on the thickness of the deposited layer and the degree of lattice mismatch between the deposited material and the underlying substrate.

As the thickness of a strained SiGe film increased above a certain thickness, known as the critical thickness, the film tends to relax to its natural lattice constant as the formation of misfit dislocations at the film/substrate interface, and threading dislocations within the film, becomes energetically favorable. Vertically propagating (for example, threading and pile-up) dislocations can lead to reduced carrier mobility, current leakage, reduced device performance, and device failure. Such dislocations can also contribute to planarity defects in the resulting film surface. Consequently, methods have been developed for blanket-depositing a SiGe layer having a reduced defect density, and thus improved planarity.

In one embodiment of the present invention, a method for blanket depositing a SiGe film comprises intermixing a silicon source, a germanium source and an etchant to form a gaseous precursor mixture. The method further comprises flowing the gaseous precursor mixture over a substrate under chemical vapor deposition conditions. The method further comprises depositing a blanket layer of epitaxial SiGe onto the substrate.

In another embodiment of the present invention, a method comprises providing a single crystal silicon substrate in a chemical vapor deposition chamber. The substrate has a surface pattern formed thereon. The method further comprises supplying a mass of silicon precursor into the chamber. The method further comprises supplying a mass of germanium precursor into the chamber. The method further comprises supplying a mass of etchant into the chamber. The mass of etchant supplied is less than the mass of silicon precursor and the mass of germanium precursor, combined. The method further comprises depositing a blanket SiGe film over the substrate and the surface pattern formed thereon.

BRIEF DESCRIPTION OF THE DRAWING

Exemplary embodiments of the methods disclosed herein are illustrated in the accompanying drawing, which are for illustrative purposes only. The drawing comprises the following figure.

FIG. 1 is a cross-sectional schematic diagram illustrating an exemplary SiGe film deposited over a patterned wafer.

DETAILED DESCRIPTION OF PREFERRED EMBODIMENTS

A blanket SiGe layer having a reduced defect density can be formed on a silicon substrate by supplying to a CVD chamber containing the substrate a precursor gas mixture comprising a silicon source, a germanium source, and an etchant. The blanket (non-selective) deposition can occur over a bare wafer or over a patterned substrate, for example having windows which could otherwise be used in a selective deposition process. Crystalline defects are preferentially removed by the etchant gas during the blanket SiGe deposition, thereby resulting in a smoother SiGe surface having fewer defects as compared to a SiGe material deposited without the etchant in the precursor gas mixture. In a preferred embodiment, a blanket SiGe layer is formed having an etch pit density of less than approximately $10^7$ defects $cm^{-2}$. More preferably, a blanket SiGe layer is formed having an etch pit density of less than approximately $10^5$ defects $cm^{-2}$.

An exemplary SiGe film produced according to the methods disclosed herein is illustrated in FIG. 1. In particular, FIG. 1 illustrates a silicon substrate 10 having a surface pattern 20, commonly referred to as a shallow trench isolation ("STI") scheme, formed thereon. For example, the surface pattern 20 can comprise interconnected dielectric material that forms a plurality of distinct windows 25 on the surface of the substrate 10. Exemplary materials that can be used to form the surface pattern 20 include silicon nitride and silicon oxide. A blanket SiGe film 30 is disposed over the substrate 10 and surface pattern 20, forming a relatively smooth SiGe surface 35 over the substrate 10. In such embodiments, amorphous SiGe and/or polycrystalline SiGe (indicated by reference numeral 32) forms in a region over the surface pattern 20, whereas epitaxial SiGe (indicated by reference numeral 34) forms in a region over the substrate 10. An etchant, such as hydrogen chloride, can be supplied to the deposition chamber to smooth the surface of the resulting blanket SiGe film. The amount of etchant supplied is generally less than the amount of etchant supplied in a selective deposition process, yet the amount is sufficient to provide a reduced deposition rate over the surface pattern 20.

As used herein the term "blanket" indicates that a significant coverage of any surface pattern 20 is covered with SiGe. It should be recognized that in other embodiments, the blanket SiGe film 30 can be deposited directly over a bare substrate, or a substrate with intervening blanket layers, that does not include any surface pattern.

Exemplary silicon sources include, but are not limited to, silane, disilane, trisilane, chlorosilane, dichlorosilane, trichlorosilane, and tetrachlorosilane. Exemplary germanium sources include, but are not limited to, germane, digermane, trigermane, chlorogermane, dichlorogermane, trichlorogermane, and tetrachlorogermane. Exemplary etchants include, but are not limited to, hydrogen fluoride and hydrogen chloride. In an exemplary embodiment, the silicon source, the germanium source, and the etchant are intermixed to form the precursor gas mixture in various ratios, as appropriate for particular applications, and as can be determined by routine experimentation. In particular, in such embodiments, the relative amounts of silicon source and germanium source in the precursor gas mixture are selected to result in an epitaxial SiGe layer having a desired SiGe ratio.

Preferably, the germanium content of a SiGe film grown according to the methods set forth herein is between approximately 10% and approximately 100%. More preferably, the germanium content of a SiGe film grown according to the methods set forth herein is between approximately 20% and approximately 100%. Most preferably, the germanium content of a SiGe film grown according to the methods set forth herein is between approximately 40% and approximately 80%. In a particular embodiment, the germanium content of a SiGe film grown according to the methods set forth herein is between approximately 20% and approximately 50%.

As the relative amount of etchant in the precursor gas mixture is increased, the planarity and/or defect density of the resulting SiGe film generally improves. However, excessive amounts of etchant can disadvantageously decrease the deposition rate of the SiGe film. In one embodiment, the etchant comprises hydrogen chloride. In a preferred embodiment, the etchant is supplied into the deposition chamber at between approximately 1 sccm and approximately 200 sccm. For example, in one embodiment wherein the etchant is supplied into a single-wafer deposition chamber, the etchant is supplied at between approximately 1 sccm and approximately 100 sccm.

In a modified embodiment, etchant is supplied to the deposition chamber for a portion of the period of SiGe film growth; that is, in such embodiments the flow of etchant can be halted when a desired planarity is achieved. This configuration advantageously provides an increased SiGe film growth rate once the etchant flow is halted. In another modified embodiment, etchant is supplied to the deposition chamber only after a certain thickness of SiGe has been grown.

In one embodiment, the precursor gas mixture comprises an amount of etchant that is less than the combined amounts of the silicon source and the germanium source, as measured on a weight basis. For example, in one such embodiment, a hydrogen chloride etchant is supplied into the deposition chamber at between approximately 25 sccm and approximately 50 sccm, dichlorosilane is supplied into the deposition chamber at approximately 20 sccm, and germane is supplied into the deposition chamber at approximately 5 sccm. In another embodiment, the precursor gas mixture comprises an amount of etchant that is between approximately 1% and approximately 50% of the combined amounts of the silicon source and the germanium source, as measured on a weight basis.

As described herein, routine experimentation can be used to determine certain deposition conditions to obtain film parameters desired in a particular application, such as surface smoothness or etch pit density. Deposition conditions that can be determined experimentally include deposition temperature and deposition pressure. In a preferred embodiment, the deposition temperature is between approximately 350° C. to approximately 1200° C., depending on the nature of the silicon and germanium sources. In particular, the deposition temperature range depends on the particular silicon and germanium sources, with lower temperatures being more appropriate as the thermal stability of the source decreases. For example, in one embodiment, wherein dichlorosilane, germane and hydrogen chloride are provided to the deposition chamber, the deposition temperature is between approximately 500° C. and approximately 1000° C. Most preferably, under such deposition conditions, the deposition temperature is between approximately 800° C. and approximately 900° C. TABLE A shows ranges of preferred hydrogen chloride etchant flow rates to a single wafer deposition chamber for given deposition temperatures.

TABLE A

| Temperature Range (° C.) | Etchant Flow Rate (sccm) |
| --- | --- |
| 350-500 | 1-25 |
| 350-900 | 1-50 |
| 800-900 | 25-50 |
| 850-1050 | 50-100 |
| 1000-1100 | 70-200 |

The total pressure in the CVD chamber is preferably in the range of approximately 0.200 Torr to approximately 850 Torr, more preferably in the range of approximately 1 Torr to approximately 760 Torr, even more preferably in the range of approximately 1 Torr to approximately 100 Torr, and most preferably in the range of approximately 1 Torr to approximately 60 Torr.

In a preferred embodiment, an approximately 1 to 2 μm thick SiGe film having a surface roughness of less than approximately 40 Å rms is deposited. More preferably, an approximately 1 to 2 μm thick SiGe film having a surface roughness of less than approximately 30 Å rms is deposited. Most preferably, an approximately 1 to 2 μm thick SiGe film having a surface roughness of less than approximately 20 Å rms is deposited.

In designing a process recipe for given precursors and a given reactor, an existing process for depositing epitaxial SiGe that uses particular silicon and germanium sources without etchant can be used as a control. The planarity and defect density of blanket-deposited epitaxial SiGe layers deposited under these control conditions can be determined by known methods and can be used as a baseline to evaluate the improvement provided when an etchant is added to the precursor gas mixture. Deposition of the improved epitaxial SiGe layer over substantially the entire substrate occurs as the deposition gas flows over the substrate under the selected deposition conditions. In one embodiment, the substrate comprises a single crystal material, such as single crystal silicon. In another embodiment, a graded epitaxial SiGe film is produced by varying the relative amounts of silicon source and germanium source that flow over the substrate as a function of deposition time.

In an exemplary embodiment, a suitable manifold is used to supply the silicon source, the germanium source, and the etchant to the CVD chamber in which the SiGe film deposition is conducted. In one embodiment, the silicon source, germanium source and etchant are intermixed before being introduced into the deposition chamber; in other embodiments these precursor gases are intermixed within the deposition chamber. Gas flow rates for a particular embodiment can be determined by routine experimentation, depending on the size and other parameters of the deposition chamber.

In one embodiment, the deposition chamber is a single-wafer, horizontal gas flow reactor that is radiatively heated. Suitable reactors of this type are commercially available; one exemplary such reactor is the Epsilon® series of single-wafer epitaxial reactors commercially available from ASM America, Inc. (Phoenix, Ariz.), further details of which are provided in U.S. patent application Publication U.S. 2002/0173130 A1, published on 21 Nov. 2002, the entire contents of which are hereby incorporated by reference herein. While the processes described herein can also be implemented in other reactors, such as reactors with showerhead gas distribution configurations, benefits in increased uniformity and deposition rates have been found particularly effective in the horizontal, single-pass, laminar gas flow arrangement of the Epsilon® chambers.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than deposition of SiGe films.

We claim:

1. A method for blanket depositing a SiGe film comprising:
   intermixing a silicon source, a germanium source and an etchant to form a gaseous precursor mixture;
   flowing the gaseous precursor mixture over a substrate under chemical vapor deposition conditions; and
   depositing a blanket layer of epitaxial SiGe over the substrate, the epitaxial SiGe formed from at least some of the components of the gaseous precursor mixture.

2. The method of claim 1, wherein an underlying blanket layer is positioned over the substrate, such that the blanket layer of epitaxial SiGe is deposited over the underlying blanket layer.

3. The method of claim 1, wherein the substrate is patterned with windows of single crystal material framed by a dielectric material.

4. The method of claim 1, wherein the substrate is patterned with windows of single crystal material framed by a dielectric material, wherein the dielectric material is an oxide.

5. The method of claim 1, wherein the substrate is patterned with windows of single crystal material within a dielectric material, wherein the dielectric material is a nitride.

6. The method of claim 1, wherein the substrate is patterned with a shallow trench isolation scheme.

7. The method of claim 1, wherein the blanket layer of epitaxial SiGe has a surface roughness of less than approximately 40 Årms.

8. The method of claim 1, wherein the blanket layer of epitaxial SiGe has a surface roughness of less than approximately 20 Årms.

9. The method of claim 1, wherein the substrate comprises a bare single crystal silicon substrate.

10. The method of claim 1, wherein the epitaxial SiGe film has a greater silicon content at the interface with the substrate than at other points in the film.

11. The method of claim 1, wherein the silicon source is selected from the group consisting of silane, disilane, trisilane, chlorosilane, dichlorosilane, trichlorosilane, and tetrachlorosilane.

12. The method of claim 1, wherein the germanium source is selected from the group consisting of germane, digermane, trigermane, chlorogermane, dichlorogermane, trichlorogermane, and tetrachlorogermane.

13. The method of claim 1, wherein the etchant comprises hydrogen chloride.

14. The method of claim 1, wherein the etchant is present in an amount that is less than the combined amounts of the silicon source and the germanium source, on a weight basis.

15. The method of claim 1, wherein the blanket layer of epitaxial SiGe has a greater degree of planarity as compared to a reference blanket layer of epitaxial SiGe deposited under comparable conditions, except in the absence of the etchant.

16. The method of claim 1, wherein the blanket layer of epitaxial SiGe has a reduced density of defects as compared to a reference blanket layer of epitaxial SiGe deposited under comparable conditions, except in the absence of the etchant.

17. The method of claim 1, wherein the blanket layer of epitaxial SiGe has an etch pit density of less than $10^7$ defects $cm^{-2}$.

18. The method of claim 1, wherein the blanket layer of epitaxial SiGe has an etch pit density of less than $10^5$ defects $cm^{-2}$.

19. A method comprising:
   providing a single crystal silicon substrate in a chemical vapor deposition chamber;
   supplying a mass of silicon precursor into the chamber;
   supplying a mass of germanium precursor into the chamber;
   supplying a mass of etchant into the chamber, wherein the mass of etchant supplied is less than the mass of silicon precursor and the mass of germanium precursor, combined; and
   depositing a blanket SiGe film over the substrate.

20. The method of claim 19, wherein the substrate is a bare wafer.

21. The method of claim 19, wherein the substrate is patterned with windows of single crystal material with a dielectric material.

22. The method of claim 19, wherein the substrate is a wafer having a first blanket layer deposited thereover, and wherein the SiGe film is deposited as a second blanket layer over the first blanket layer.

23. The method of claim 19, wherein the chemical vapor deposition chamber is a single wafer chamber.

24. The method of claim 19, wherein the SiGe film has a greater silicon content at the interface with the substrate than at other points in the film.

25. The method of claim 19, wherein the silicon precursor is selected from the group consisting of silane, disilane, trisilane, chlorosilane, dichlorosilane, trichlorosilane, and tetrachlorosilane.

26. The method of claim 19, wherein the germanium source is selected from the group consisting of germane, digermane, trigermane, chlorogermane, dichlorogermane, trichlorogermane, and tetrachlorogermane.

27. The method of claim 19, wherein the etchant comprises hydrogen chloride.

28. The method of claim 19, wherein the germanium content of the blanket SiGe film is between approximately 20% and approximately 100%.

29. The method of claim 19, wherein the germanium content of the SiGe film is between approximately 40% and approximately 80%.

30. The method of claim 19, wherein the etchant is supplied into the chamber at a rate between approximately 25 sccm and 50 sccm.

31. The method of claim 19, wherein the chamber has a temperature between approximately 350° C. and approximately 1100° C. during deposition of the SiGe film.

32. The method of claim 19, wherein the chamber has a temperature between approximately 800° C. and approximately 900° C. during deposition of the SiGe film.

33. The method of claim 19, wherein the chamber has a pressure between approximately 0.200 Torr and approximately 850 Torr during deposition of the SiGe film.

34. The method of claim 19, wherein the chamber has a pressure between approximately 1 Torr and approximately 100 Torr during deposition of the SiGe film.

35. The method of claim 19, wherein the SiGe film has a surface roughness of less than approximately 40 Årms.

36. The method of claim 19, wherein the SiGe film has a surface roughness of less than approximately 30 Årms.

37. The method of claim 19, wherein the SiGe film has a surface roughness of less than approximately 20 Årms.

38. A method of blanket depositing a SiGe film comprising:
  intermixing a silicon source gas and a germanium source gas;
  adding an etchant to the intermixed source gases to from a gaseous precursor mixture;
  flowing the gaseous precursor mixture over a substrate under chemical vapor deposition conditions; and
  depositing a blanket layer of epitaxial SiGe onto the substrate;
  wherein the mass of etchant added to the intermixed source gases is less than a mass of etchant added to the intermixed source gases in a selective deposition process.

39. The method of claim 38, wherein the mass of etchant added to the intermixed source gases is less than the mass of the intermixed source gases.

40. The method of claim 38, wherein the substrate is positioned within a chemical vapor deposition chamber.

41. The method of claim 38, wherein the substrate is positioned within a chemical vapor deposition chamber, and wherein the etchant is supplied to the chamber at between approximately 1 sccm and approximately 200 sccm.

42. The method of claim 38, wherein the substrate is positioned within a chemical vapor deposition chamber, and wherein the etchant is supplied to the chamber at between approximately 25 sccm and approximately 50 sccm.

43. A method of blanket depositing a film comprising:
  providing a single crystal substrate in a chemical vapor deposition chamber;
  supplying a mass of germanium source gas into the chamber;
  supplying a mass of etchant into the chamber, wherein the mass of etchant supplied is less than the mass of germanium source gas; and
  blanket depositing a film over the single crystal substrate, wherein the film comprises germanium.

44. The method of claim 43, wherein the germanium content of the film is between approximately 20% and approximately 100%.

45. The method of claim 43, wherein the film has a surface roughness of less than approximately 40 Årms.

46. The method of claim 43, wherein the film has a surface roughness of less than approximately 20 Årms.

47. The method of claim 43, wherein the film has an etch pit density of less than $10^7$ defects $cm^{-2}$.

48. The method of claim 43, wherein the film has an etch pit density of less than $10^5$ defects $cm^{-2}$.

49. The method of claim 43, wherein the film has a greater degree of planarity as compared to a reference film deposited under comparable conditions, except in the absence of the etchant.

50. The method of claim 43, wherein the single crystal substrate is a bare wafer.

51. The method of claim 43, wherein the singe crystal substrate is patterned with windows of single crystal material with a dielectric constant.

52. The method of claim 43, further comprising supplying a mass of silicon source gas into the chamber.

* * * * *